United States Patent
Jacobs et al.

(10) Patent No.: US 6,879,377 B2
(45) Date of Patent: Apr. 12, 2005

(54) LITHOGRAPHIC APPARATUS AND DEVICE MANUFACTURING METHOD

(75) Inventors: Hernes Jacobs, Eindhoven (NL); Piet Vosters, Bladel (NL); Sven Antoin Johan Hol, Eindhoven (NL); Harmen Klaas Van Der Schoot, Vught (NL); Robert Johannes Petrus Van Diesen, Oirschot (NL); David William Callan, Norwalk (US)

(73) Assignee: ASML Netherlands B.V., Veldhoven (NL)

( * ) Notice: Subject to any disclaimer, the term of this patent is extended or adjusted under 35 U.S.C. 154(b) by 102 days.

(21) Appl. No.: 10/305,266

(22) Filed: Nov. 27, 2002

(65) Prior Publication Data

US 2003/0137643 A1 Jul. 24, 2003

(30) Foreign Application Priority Data

Nov. 30, 2001 (EP) .............................. 01204626

(51) Int. Cl.⁷ ........................... G03B 27/42; G03B 27/58
(52) U.S. Cl. ........................................ 355/53; 355/72
(58) Field of Search ............................. 355/30, 53, 72, 355/73; 269/59, 73

(56) References Cited

U.S. PATENT DOCUMENTS

| | | | |
|---|---|---|---|
| 4,993,696 A | | 2/1991 | Furukawa et al. |
| 5,901,754 A | * | 5/1999 | Elsasser et al. .............. 138/118 |
| 6,510,755 B1 | | 1/2003 | Higuchi et al. |
| 2001/0023522 A1 | * | 9/2001 | Watson et al. .............. 29/25.01 |
| 2003/0047941 A1 | * | 3/2003 | Thomas et al. .............. 285/226 |

FOREIGN PATENT DOCUMENTS

| | | |
|---|---|---|
| EP | 1 148 389 A2 | 10/2001 |
| JP | 5-198490 | 8/1993 |
| JP | 6-275486 | 9/1994 |

* cited by examiner

Primary Examiner—Rodney Fuller
(74) Attorney, Agent, or Firm—Pillsbury Winthrop LLP

(57) ABSTRACT

A lithographic projection apparatus includes a conduit that supplies utilities to a movable component in a vacuum chamber such as an object table, associated motor or sensor. The conduit comprises flexible metal bellows preventing out-gassing of the conduit due to the vacuum in the vacuum chamber while allowing movement of the movable component in at least a first degree of freedom.

11 Claims, 4 Drawing Sheets

LITHOGRAPHIC APPARATUS AND DEVICE MANUFACTURING METHOD

BACKGROUND OF THE INVENTION

1. Field of the Invention

The present invention relates to a lithographic projection apparatus.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from United States Patents U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. No. 5,969,441 and WO 98/40791.

In a lithographic apparatus, the size of features that can be imaged onto the substrate is limited by the wavelength of the projection radiation. To produce integrated circuits with a higher density of devices and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet (EUV) or soft x-ray, and possible sources include laser produced plasma sources, discharge plasma sources or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993).

Other proposed radiation types include electron beams and ion beams.

Further information with regard to the use of electron beams in lithography can be gleaned, for example, from U.S. Pat. Nos. 5,079,112 and 5,260,151, as well as from EP-A-0 965 888. These types of beams share with EUV the requirement that the beam path, including the mask, substrate and optical components, be kept in a high vacuum. This is to prevent absorption and/or scattering of the beam, whereby a total pressure of less than about $10^{-6}$ millibar is typically necessary for such charged particle beams. Otherwise, for apparatus using EUV radiation, the total vacuum pressure need only be between $10^{-3}$ and $10^{-5}$ millibar. Optical elements for EUV radiation can be contaminated, by the deposition of carbon layers on their surface, which imposes the additional requirement that hydrocarbon partial pressures should generally be kept as low as possible, for example below $10^{-8}$ or $10^{-9}$ millibar.

Working in a high vacuum imposes quite onerous conditions on the components that must be put into the vacuum. For components inside the vacuum chamber, materials should be used that minimize or eliminate contaminants and total out-gassing, i.e. both out-gassing from the materials themselves and from gases adsorbed on their surfaces. It has been found that for the desired degree of movement required by the object holders, conduits can be made of plastics materials so that they are flexible enough. However, these types of materials often are deleterious to the vacuum in the vacuum chamber because out-gassing of contaminants as described above will occur. There are plastics better suited for vacuum applications (e.g. TEFLON®), but the large number of cables and lines which are required to be led through the vacuum present a large surface area to out-gassing of contaminants. It will be difficult to get a partially hydrocarbon pressure below $10^{-8}$ or $10^{-9}$ millibar, for example, when plastic conduits are used. Furthermore, the risk of leaks from conduits makes their use impractical. It would be very desirable to be able to reduce the use of conduits. However, conventional designs of substrate, mask and transfer stages are very complicated and employ large numbers of sensors and drive arrangements, which all need a large number of conduits for conveying water and gases and for protecting electric wiring.

To circumvent this problem it has been proposed in U.S. Pat. No. 4,993,696 to use metal pipes made of stainless material for the supply and exhaustion of an operating fluid or gas in a vacuum ambience. Two adjacent pipes may then be coupled with each other by a joint, which is arranged to allow pivotable movement of one of the pipes relative to the other. The metal pipes will not suffer from out-gassing, as nylon conduits will do. A disadvantage of the joints is that it is very difficult to design joints that are totally closed for fluids or gases in a vacuum environment. Therefore there may be leakage of gases through the joint to the vacuum environment that will contaminate the vacuum environment.

Another solution has been proposed by European Patent Application 1 052 549. Conduits are fed through hollow pipes that are rigidly connected to a movable object table and the pipes are used to transfer movements from outside a vacuum chamber to the table. The pipes are hollow and the pressure within the pipes is equal to the pressure outside the vacuum chamber. Between the wall of the vacuum chamber and the pipes differentially pumped seals are used to prevent the leakage of air to the vacuum chamber and at the same time allowing for movement of the object table.

SUMMARY OF THE INVENTION

It is an aspect of the present invention to provide a lithographic projection apparatus with substantially reduced problems due to out-gassing of materials used in a conduit in a vacuum chamber.

According to the present invention there is provided a lithographic projection apparatus including a radiation system constructed and arranged to provide a projection beam of radiation; a first object table constructed and arranged to support a patterning device, the patterning device constructed and arranged to pattern the projection beam according to a desired pattern; a second object table constructed and arranged to hold a substrate; a vacuum chamber provided with a first gas evacuating device constructed and arranged to generate a vacuum beam path for the projection beam; a projection system constructed and arranged to project the patterned beam onto a target portion of the substrate; and a conduit constructed and arranged to provide utilities to a component moveable in at least one degree of freedom in the vacuum chamber, wherein the conduit comprises a flexible metal bellows.

The term conduit refers to the cables and tubes that are used to transport the utilities to the moveable component. More specifically the term conduit refers to such items as power cords, signal carriers, gas tubes (e.g. that supply gas to a gas bearing in the table), coolant tubes, etc. Moveable components inside the vacuum chamber including the mask table and/or the substrate table and/or associated motors and/or sensors may be connected to a frame outside the vacuum chamber in this manner.

The flexible metal bellows will be substantially airtight and at the same time flexible enough to allow for movement of the component. The metal surface of the flexible metal bellows will not suffer from large out-gassing and at the same time be easily cleanable so that no problems will occur with any contaminants adsorbed on the surface of the flexible metal bellows. Further, the conduit with the flexible metal bellows is light weight in comparison with the pipes with movable joints suggested in U.S. Pat. No. 4,993,696 and the differential pumped seals suggested in European Patent Publication 1 052 549. The flexible metal bellows also allows for some more degrees of freedom than the solutions proposed in the mentioned prior art.

The conduit may be provided with a fixed bend in a part of the conduit that restricts the amount of bending in the rest of the conduit during movement of the component. If the flexible metal bellows bends a lot of time during usage the flexible metal bellows will loose its strength and may get leak. This problem is alleviated by limiting the bending during usage of the metal bellows to a minimum radius. This minimum radius requirement for the bellows may require a lot of space in the machine for the bellows. By having a fixed bend in a particular part of the conduit the bending of the rest of the conduit is limited during usage while the minimum radius requirement is loosened. The large degree of bending in the particular part is fixed so hardly any wear of the metal bellows in that part will occur.

The conduit may be connected to a damping device constructed and arranged to dampen vibrations in the conduit. Vibrations in the conduit may have an influence on the position of the movable component which influence should be avoided as much as possible.

According to a second aspect of the present invention there is provided a device manufacturing method including providing a substrate that is at least partially covered by a layer of radiation-sensitive material; providing a vacuum to a vacuum chamber; projecting a projection beam of radiation using a radiation system through the vacuum chamber; using a patterning device to endow the projection beam with a pattern in its cross-section; projecting the patterned projection beam of radiation onto a target portion of the layer of radiation-sensitive material; and providing utilities through a conduit to at least one component moveable in at least a first direction in the vacuum chamber through a flexible metal bellows.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. It should be appreciated that, in the context of such alternative applications, any use of the terms "reticle," "wafer" and "die" in this text should be considered as being replaced by the more general terms "mask," "substrate" and "target portion," respectively.

BRIEF DESCRIPTION OF THE DRAWINGS

The present invention will be described below with reference to exemplary embodiments and the accompanying schematic drawings, in which.

In the Figures, corresponding reference symbols indicate corresponding parts.

DETAILED DESCRIPTION

Figure 1:
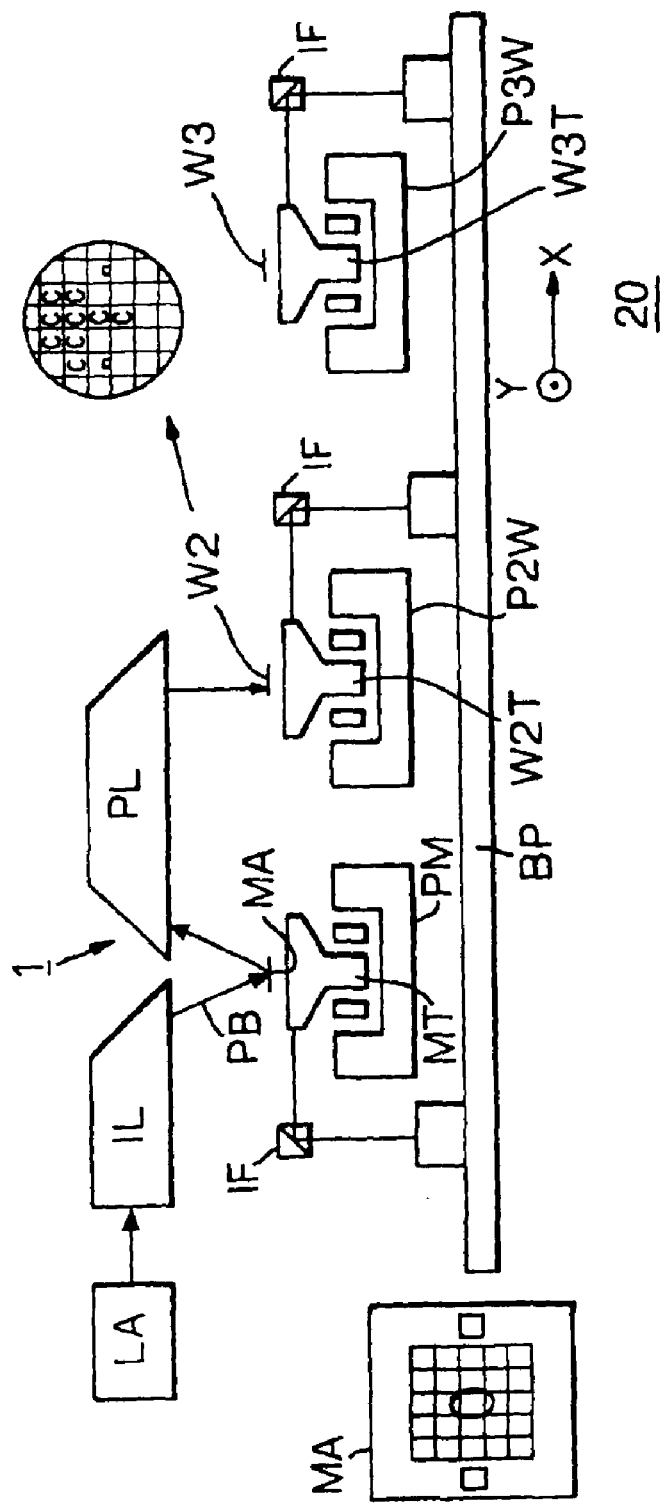
FIG. 1 depicts a lithographic projection apparatus.

FIG. 1 schematically depicts a lithographic projection apparatus 1 for including radiation system LA, IL constructed and arranged to supply a projection beam PB of radiation (e.g. UV or EUV radiation, electrons or ions); a first (mask) object table MT provided with a first object (mask) holder constructed and arranged to hold a mask MA (e.g. a reticle), and connected to a first positioning device PM that accurately positions the mask MA with respect to a projection system or lens PL; a second object (substrate) table W2T provided with a second object (substrate) holder constructed and arranged to hold a substrate W2 (e.g. a resist-coated silicon wafer), and connected to a second positioning device P2W that accurately positions the substrate with respect to the lens PL; a third object (substrate) table W3T provided with a third object (substrate) holder constructed and arranged to hold a substrate W3 (e.g. a resist-coated silicon wafer), and connected to a third positioning device P3W that accurately positions the substrate with respect to the lens PL. The projection system or lens PL (e.g. a refractive or catadioptric system, a mirror group or an array of field deflectors) is constructed and arranged to image an irradiated portion of the mask MA onto a target portion C of the substrate W.

The radiation system comprises a source LA that produces a beam of radiation (e.g. an undulator or wiggler provided around the path of an electron beam in a storage ring or synchrotron, a plasma source, an electron or ion beam source, a mercury lamp or a laser). The beam is caused to traverse various optical components included in an illumination system IL so that the resultant beam PB has a desired shape and intensity distribution in its cross-section.

The beam PB subsequently impinges upon the mask MA that is held in the mask holder on the mask table MT. Having been selectively reflected (or transmitted) by the mask MA, the beam PB passes through the lens PL which focuses the beam PB onto a target portion C of the substrate W2, W3. With the aid of the second and third positioning devices P2W, P3W, interferometers IF, and alignment marks M1, M2 and P1, P2, the substrate tables W2T, W3T can be moved accurately, e.g. so as to position different target portions C in the path of the beam PB. Similarly, the first positioning device PM and interferometers IF can be used to accurately position the mask MA with respect to the path of the beam PB, e.g. after mechanical retrieval of the mask MA from a mask library or during a scanning motion.

Movement of the object tables MT, W2T, W3T is generally realized with the aid of a long-stroke module (coarse positioning) and a short-stroke module (fine positioning), which are not explicitly depicted in FIG. 1.

The apparatus 1 can be used in two different modes:

1. In step mode, the mask table MT is kept essentially stationary, and an entire mask image is projected in one go (i.e. a single "flash") onto a target portion. The substrate table W2T, is then shifted in the X and/or Y directions so that a different target portion can be irradiated by the beam PB;

2. In scan mode, essentially the same scenario applies, except that a given target portion is not exposed in a single "flash." Instead, the mask table MT is movable in a given direction (the so-called "scan direction", e.g. the Y direction) with a speed v, so that the projection beam PB is caused to scan over a mask image. Concurrently, the substrate table W2T is simultaneously moved in the same or opposite direction at a speed V=Mv, in which M is the magnification of the lens PL (e.g., M=¼ or ⅕). In this manner, a relatively large target portion can be exposed, without having to compromise on resolution.

In a lithographic projection apparatus according to the present invention, the first object (mask) table MT and at least one of the second and third object (substrate) tables W2T or W3T are provided in a vacuum chamber 20. The vacuum inside the vacuum chamber 20 is created with a vacuum evacuating device, for example a pump.

Figure 2:
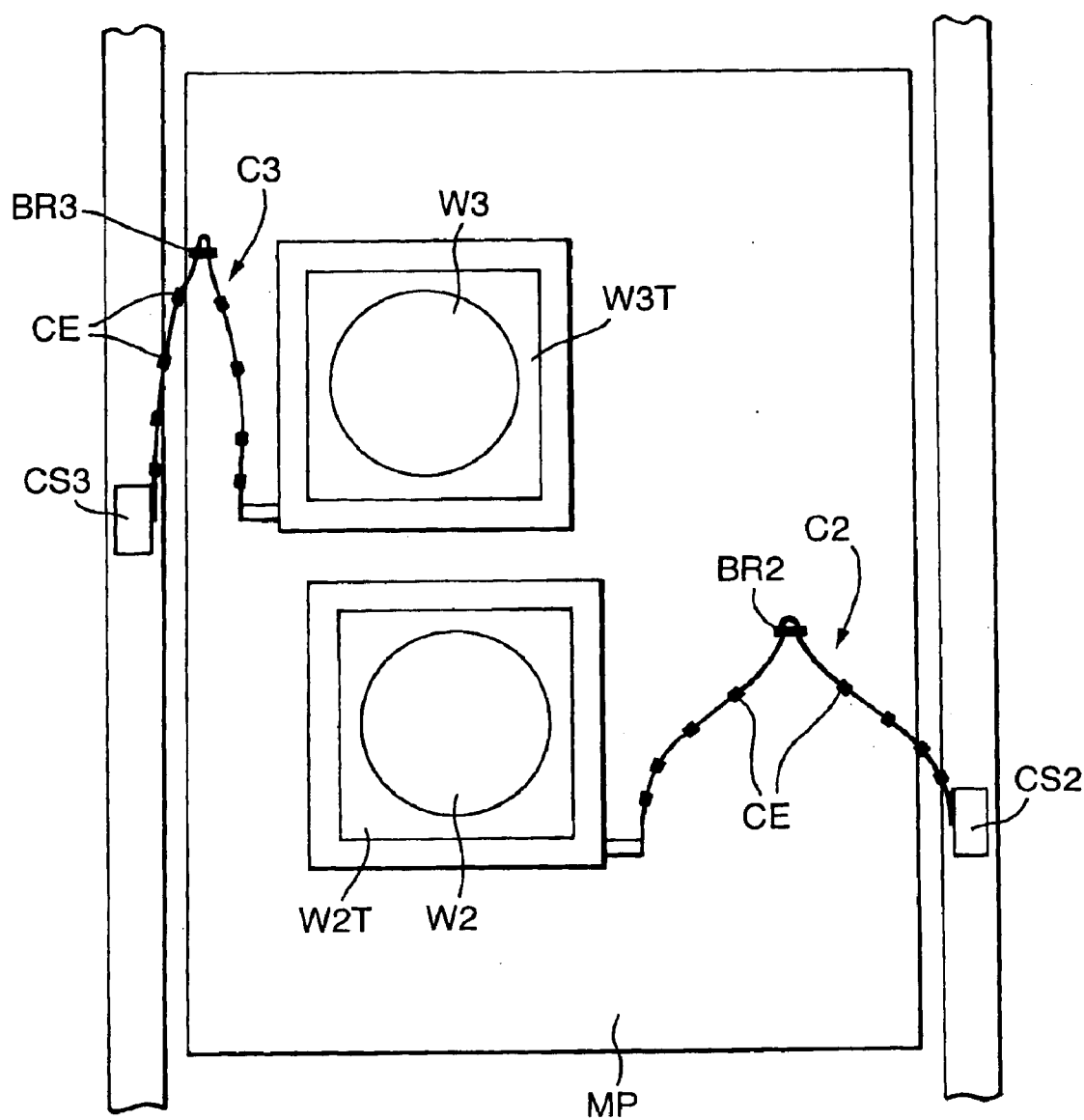
FIG. 2 is a schematic plan view showing a conduit for employing a flexible metal bellow according to an exemplary embodiment of the present invention.

FIG. 2 is a schematic plan view showing a conduit according to the invention. Two conduits C2 and C3 connect the substrate tables W2T, W3T, respectively, to their respective cable shuttle CS2, CS3. The cable shuttles CS2 and CS3 will follow their respective table W2T, W3T in the X-direction by having a detector that detects the position of the table with respect to the cable shuttle and that causes the cable shuttle to adjusts its position if the table moves in the X-direction away from the cable shuttle, so that the shuttle follows the substrate table. In the Y-direction, the conduits C2, C3 will allow for movement of the substrate tables W2T, W3T. The substrate tables W2T, W3T are positioned with the aid of a planar motor comprising a magnet array in a magnet plate MP and coils in the substrate tables W2T, W3T for movement and levitation of the substrate tables W2T, W3T.

As depicted in FIG. 2, both tables W2T, W3T have a single conduit. However, the tables may have double conduits. Additional conduits can be mounted on the inside of the depicted conduits. Both conduits may be coupled to each other at a fixed bend so that they will be kept away from each other during movement of the substrate table.

Both substrate tables W2T, W3T may exchange position by moving in the Y-direction to their respective cable shuttle CS2, CS3 and subsequently move in the X-direction passing each other. During an exchange of tables, the cable shuttles will also move in the X-direction.

Each conduit C2, C3 may be provided with a fixed bend BR2, BR3 in a particular part of the conduit C2, C3 that restricts the amount of bending in the rest of the conduit C2, C3 during movement of the table W2T, W3T. If the flexible bellows FB bend often during usage the flexible bellows FB may loose its strength and may leak. This problem is alleviated by limiting the bending during usage of the flexible bellows FB to a minimum radius. The minimum radius requirement for the flexible bellows FB may require a lot of space in the machine for the flexible bellows FB. By having a fixed bend BR2, BR3 in a particular part of the conduit C2, C3 the bending of the rest of the conduit is limited during usage while the minimum radius requirement is loosened. The degree of bending in the fixed bend BR2, BR3 is fixed so hardly any wear of the flexible bellows FB in that part will occur. This also prevents wear and at the same time loosens the space requirements for conduits of non-metal material used in a non-vacuum lithographic projection apparatus. The conduit may then be made of plastic or rubber.

Figure 3:
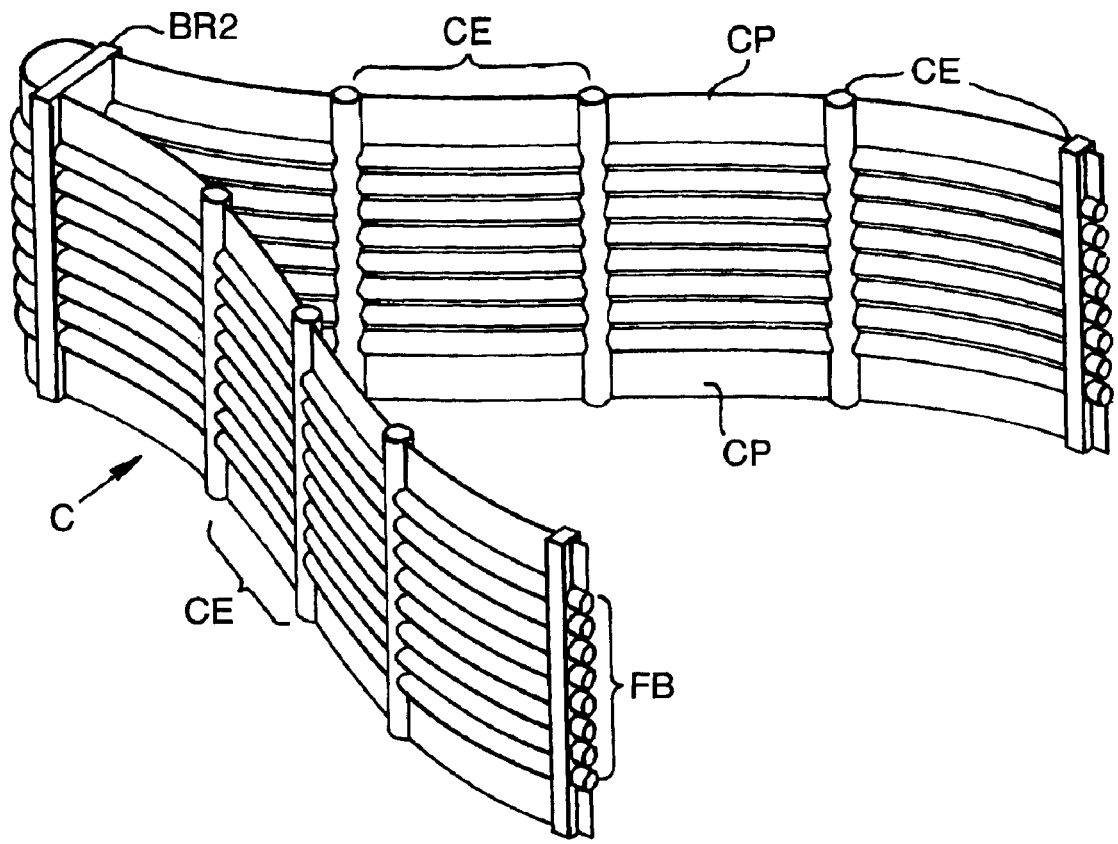
FIG. 3 is a view in perspective on the conduit shown in FIG. 2.

Vibrations in the conduit may be damped by providing aluminum material to the conduits C2, C3. The aluminum acts as a dampener because the magnet field of the magnet plate MP will cause an eddy current within the aluminum that dampens the vibrations of the conduit C2, C3 that produce heat. The fixed bends BR2, BR3 may be provided with aluminum for this purpose. Connecting elements CE that are used to connect the flexible bellows FB (see FIG. 3) with the conduit plates CP may also be made from aluminum for the same purpose. The connecting elements CE increase the rigidity in the Z-direction of the conduit C2, C3 so that sagging of the flexible bellows FB is avoided.

The conduit plates CP are used to increase the rigidity of the conduit in the Z-direction while at the same time supplying some flexibility to the conduit in the X- and Y-direction. The flexibility over the length of the conduit plates CP may be varied to adjust the flexibility locally of the conduit C2, C3. The flexibility of the conduit plate CP in a particular part of the conduit C2, C3 will have its influence on the extent of bending in the flexible bellows FB at the particular part in the X- and Y-direction. In general, a flexible bellows FB will have its maximum bending near the position where it is connected to the a fixed element, i.e. for the conduit C2 near the substrate table W2T or the cable shuttle CS2. By increasing the rigidity of the conduit plate CP near those positions the bending can be better divided over the total length of the flexible bellows FB so that the wear of the flexible bellows FB is better divided over the length and the total lifetime will be longer. Varying the rigidity of the conduit plate CP can be done by varying the outer dimensions of the conduit plate CP or by making holes in the conduit plate CP. Experiments can be executed to determine the position along the conduit C2, C3 where the wear of the flexible bellows FB is maximum and by increasing the rigidity of the conduit plate CP at those positions where the wear can be better divided.

By having the connecting elements CE made of a metal having a high thermal conductivity (e.g. aluminum), the connecting elements CE can act as a heat sink. The heat generated by copper wires, which are also connected to the connecting elements CE and which serve as a power cord or a signal wire to the substrate tables W2T, W3T, may then be easily transferred to a cooling medium (e.g. water) flowing in a flexible bellows FB. By using several connecting elements CE along the conduit a regular heat distribution pattern is created with smaller temperature differences along the wire, allowing for a better temperature control within the vacuum chamber 20.

Figure 4:
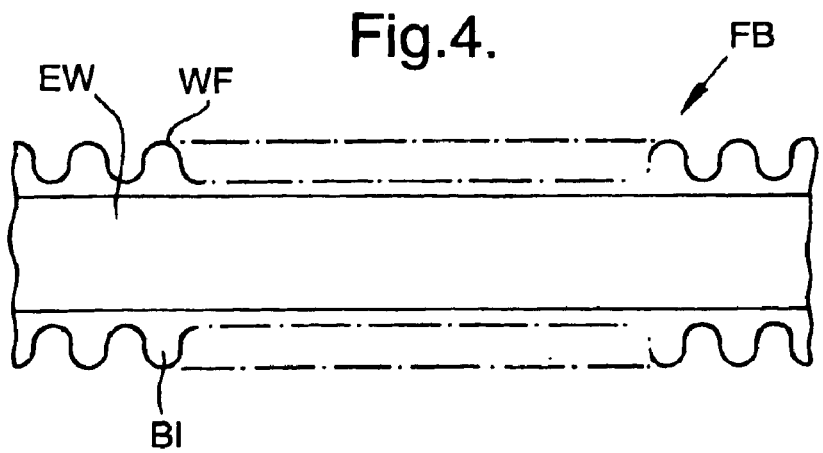
FIG. 4 is a cross-sectional view on the flexible metal bellows according to the invention and for usage in the conduit in FIGS. 2 and 3.

FIG. 4 is a cross-sectional view on the flexible bellows FB according to the invention. The flexible bellows FB may be provided with electric wiring or a water tube EW in its interior B1. The flexible bellows FB itself is made from metal in a waveform WF giving flexibility to the bellows.

It is possible to feed forward compensate for the influence of the mass of the conduits C2, C3 on the movements of the substrate tables W2T, W3T. This can be done either by calibration of the force influence or by making an algorithm calculating this force influence. Alternatively, force sensors can be used between the substrate table W2T, W3T and the conduit C2, C3, which measure the force exerted by the substrate table W2T, W3T on the conduit C2, C3 and feed back compensate that force by adjusting the force exerted by the second and third positioning devices P2W, P3W. Further information with regard to such a feed back system can be gleaned from European Patent Application EP 1 018 669.

Figure 5:
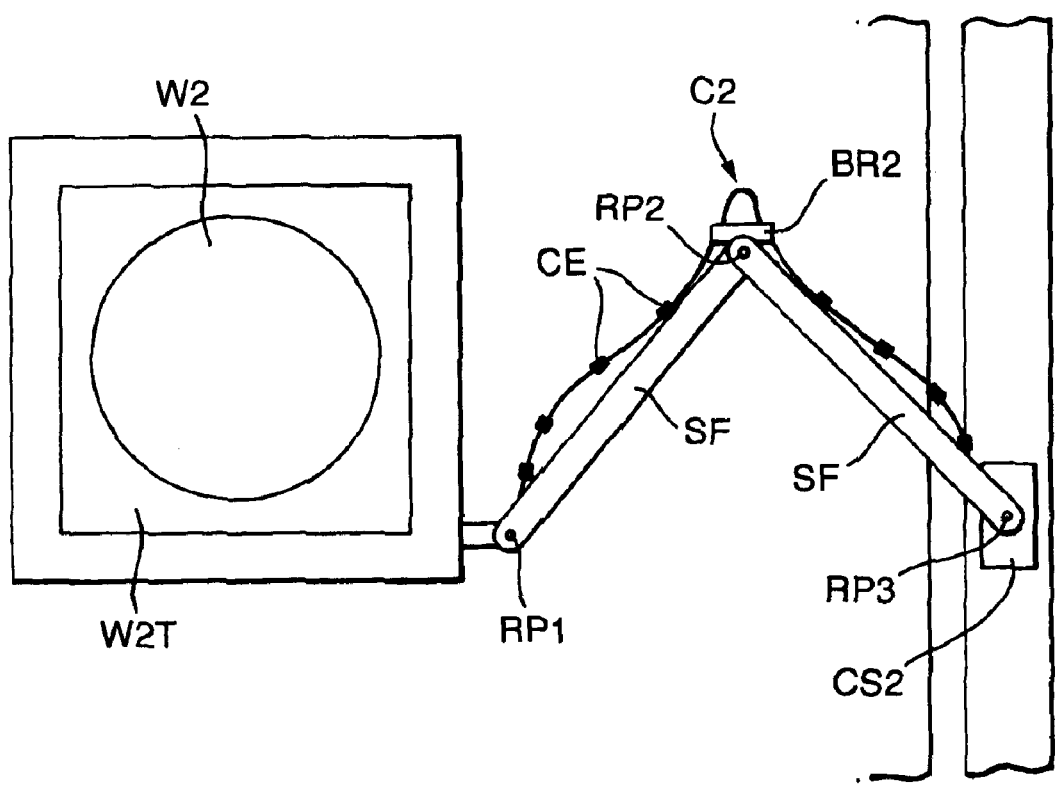
FIG. 5 is a schematic view on a conduit according to a second exemplary embodiment of the present invention.

FIG. 5 shows a second exemplary embodiment of the present invention. In this figure, the substrate table W2T and the conduit C2 of FIG. 2 is provided with a sub-frame SF. The sub-frame SF is connected to the substrate table W2T at a first rotation point RP1, with the fixed bend BR2 at a second rotation point RP2 and the cable shuttle CS2 at a third rotation point RP3. The sub-frame SF comprises two legs, which rotate around the second rotation point RP2 with each other. The sub-frame SF positions the fixed bend BR2 during movement in a rigid manner in a particular position so that vibrations will be decreased.

The invention is described above in relation to exemplary embodiments. However, it will be appreciated that the invention is not limited by the above description. In particular, the invention has been described above in relation to the wafer stage of a lithographic apparatus that is accommodated in a vacuum chamber. However, it will readily be appreciated that the present invention is equally applicable to mask tables or to any movable mirrors in the apparatus.

What is claimed is:

1. A lithographic projection apparatus, comprising:
   a radiation system constructed and arranged to provide a projection beam of radiation;
   a first object table constructed and arranged to support a patterning device, the patterning device constructed and arranged to pattern the projection beam according to a desired pattern;
   a second object table to hold a substrate;
   a vacuum chamber provided with a first gas evacuating device constructed and arranged to generate a vacuum beam path for the projection beam;
   a projection system constructed and arranged to project the patterned beam onto a target portion of the substrate; and
   a conduit constructed and arranged to provide utilities to a component moveable in at least one degree of freedom in the vacuum chamber, wherein the conduit comprises a flexible metal bellows.

2. A lithographic projection apparatus according to claim 1, wherein the conduit comprises a flexible plate constructed and arranged to carry the flexible metal bellows in a vertical direction and guide the bellows in second and third horizontal directions.

3. A lithographic projection apparatus according to claim 2, wherein the conduit comprises a connecting element constructed and arranged to connect the flexible plate with the flexible metal bellows.

4. A lithographic projection apparatus according to claim 3, wherein the connecting element is made of a metal having a high thermal conductivity.

5. A lithographic projection apparatus according to claim 2, wherein the flexibility of the flexible plate in the second and third directions is varied over its total length.

6. A lithographic projection apparatus according to claim 1, wherein the conduit comprises a fixed bend in a part of the conduit constructed and arranged to restrict the space required for the conduit.

7. A lithographic projection apparatus according to claim 1, wherein the conduit is connected to a dampener device constructed and arranged to dampen vibrations in the conduit.

8. A lithographic projection apparatus according to claim 7, wherein the dampener device is an eddy current dampener that dampens under the influence of a magnet field provided by a magnet plate.

9. A lithographic projection apparatus according to claim 1, wherein the conduit is provided with a sub-frame constructed and arranged to prevent vibrations in the conduit.

10. A device manufacturing method, comprising:
    providing a substrate that is at least partially covered by a layer of radiation-sensitive material;
    providing a vacuum to a vacuum chamber;
    projecting a projection beam of radiation using a radiation system through the vacuum chamber;
    using a patterning device to endow the projection beam with a pattern in its cross-section;
    projecting the patterned projection beam of radiation onto a target portion of the layer of radiation-sensitive material;
    providing utilities through a conduit to at least one component moveable in at least a first direction in the vacuum chamber through a flexible metal bellows.

11. A method according to claim 10, wherein the method further comprises dampening vibrations of the conduit.

* * * * *